(12) United States Patent
Chiu et al.

(10) Patent No.: US 10,249,528 B2
(45) Date of Patent: Apr. 2, 2019

(54) INTEGRATED CIRCUIT AND MANUFACTURING METHOD THEREOF

(71) Applicant: UNITED MICROELECTRONICS CORP., Hsin-Chu (TW)

(72) Inventors: Chiu-Jung Chiu, Tainan (TW);
Hung-Chan Lin, Tainan (TW);
Yu-Chun Chen, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/681,419

(22) Filed: Aug. 20, 2017

(65) Prior Publication Data

US 2019/0035674 A1    Jan. 31, 2019

(30) Foreign Application Priority Data

Jul. 28, 2017    (CN) .......................... 2017 1 0628490

(51) Int. Cl.

| | |
|---|---|
| *H01L 21/762* | (2006.01) |
| *H01L 21/02* | (2006.01) |
| *H01L 27/06* | (2006.01) |
| *H01L 21/768* | (2006.01) |
| *H01L 29/94* | (2006.01) |
| *H01L 49/02* | (2006.01) |
| *H01L 21/8234* | (2006.01) |
| *H01L 21/28* | (2006.01) |

(52) U.S. Cl.
CPC .. *H01L 21/76237* (2013.01); *H01L 21/02197* (2013.01); *H01L 21/28202* (2013.01); *H01L 21/76822* (2013.01); *H01L 21/8234* (2013.01); *H01L 27/0629* (2013.01); *H01L 28/92* (2013.01); *H01L 29/94* (2013.01)

(58) Field of Classification Search
None
See application file for complete search history.

(56) References Cited

U.S. PATENT DOCUMENTS

| | | | |
|---|---|---|---|
| 7,534,692 B2 | 5/2009 | Jagueneau | |
| 9,564,217 B1 | 2/2017 | Zhou | |
| 2003/0213989 A1* | 11/2003 | Delpech | .............. H01L 23/5223 257/301 |
| 2017/0213896 A1* | 7/2017 | Lisiansky | ......... H01L 29/66181 |

* cited by examiner

*Primary Examiner* — Mounir S Amer
(74) *Attorney, Agent, or Firm* — Winston Hsu

(57) ABSTRACT

An integrated circuit includes a first insulation layer, a bottom plate, a first patterned dielectric layer, a medium plate, a second patterned dielectric layer, and a top plate. The first patterned dielectric layer is disposed on the bottom plate. The medium plate is disposed on the first patterned dielectric layer. At least a part of the first patterned dielectric layer and the medium plate and a part of the bottom plate are disposed in a first trench penetrating the first insulation layer. The bottom plate, the first patterned dielectric layer, and the medium plate constitute a first metal-insulator-metal (MIM) capacitor. The second patterned dielectric layer is disposed on the medium plate. The top plate is disposed on the second patterned dielectric layer. The medium plate, the second patterned dielectric layer, and the top plate constitute a second MIM capacitor. The bottom plate is electrically connected with the top plate.

20 Claims, 9 Drawing Sheets

INTEGRATED CIRCUIT AND MANUFACTURING METHOD THEREOF

BACKGROUND OF THE INVENTION

1. Field of the Invention

The present invention relates to an integrated circuit and a manufacturing method thereof, and more particularly, to an integrated circuit including a metal-insulator-metal (MIM) capacitor and a manufacturing method thereof.

2. Description of the Prior Art

In modern society, the micro-processor systems composed of integrated circuits (ICs) are applied popularly in our living. Many electrical products, such as personal computers, mobile phones, and home appliances, include ICs. With the development of technology and the increasingly imaginative applications of electrical products, the design of ICs tends to be smaller, more delicate and more diversified.

In the recent electrical products, IC devices, such as metal oxide semiconductor (MOS) transistors, capacitors, or resistors, are produced from silicon based substrates that are fabricated by semiconductor manufacturing processes. A complicated IC system may be composed of the IC devices electrically connected with one another. Generally, a capacitor structure may be composed of a top electrode, a dielectric layer, and a bottom electrode. The capacitor structure is traditionally disposed in an inter-metal dielectric (IMD) layer on a silicon based substrate and includes a metal-insulator-metal (MIM) structure. However, as the demands for more functions and higher performance of the electrical products increase continually, the complexity and the integrity of the ICs increase also, and the space for forming the capacitor structures becomes smaller relatively. Accordingly, the capacitance of the traditional capacitor structure is limited, and the related problems about the IC design may be generated.

SUMMARY OF THE INVENTION

An integrated circuit and a manufacturing method thereof are provided in the present invention. A first metal-insulator-metal (MIM) capacitor composed of a bottom plate, a first patterned dielectric layer, and a medium plate is formed in a trench. A second patterned dielectric layer and a top plate is formed on the medium plate for forming a second MIM capacitor for purposes of increasing capacitance and enhancing the capacitance density.

According to an embodiment of the present invention, an integrated circuit is provided. The integrated circuit includes a first insulation layer, a bottom plate, a first patterned dielectric layer, a medium plate, a second patterned dielectric layer, and a top plate. A first trench penetrates the first insulation layer. The bottom plate is partly disposed on the first insulation layer and partly disposed in the first trench. The first patterned dielectric layer is disposed on the bottom plate, and at least a part of the first patterned dielectric layer is disposed in the first trench. The medium plate is disposed on the first patterned dielectric layer, and at least a part of the medium plate is disposed in the first trench. The bottom plate, the first patterned dielectric layer, and the medium plate constitute a first metal-insulator-metal (MIM) capacitor. The second patterned dielectric layer is disposed on the medium plate. The top plate is disposed on the second patterned dielectric layer. The medium plate, the second patterned dielectric layer, and the top plate constitute a second MIM capacitor, and the bottom plate is electrically connected with the top plate.

According to an embodiment of the present invention, a manufacturing method of an integrated circuit is provided. The manufacturing method includes the following steps. A first trench penetrating a first insulation layer is formed first. A bottom plate is partly formed on the first insulation layer and partly formed in the first trench. A first patterned dielectric layer is formed on the bottom plate, and at least a part of the first patterned dielectric layer is formed in the first trench. A medium plate is formed on the first patterned dielectric layer, and at least a part of the medium plate is formed in the first trench. The bottom plate, the first patterned dielectric layer, and the medium plate form a first metal-insulator-metal (MIM) capacitor. A second patterned dielectric layer is formed on the medium plate, and a top plate is formed on the second patterned dielectric layer. The medium plate, the second patterned dielectric layer, and the top plate form a second MIM capacitor, and the bottom plate is electrically connected with the top plate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-7 are schematic drawings illustrating a manufacturing method of an integrated circuit according to the first embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6.

DETAILED DESCRIPTION

Figure 1:
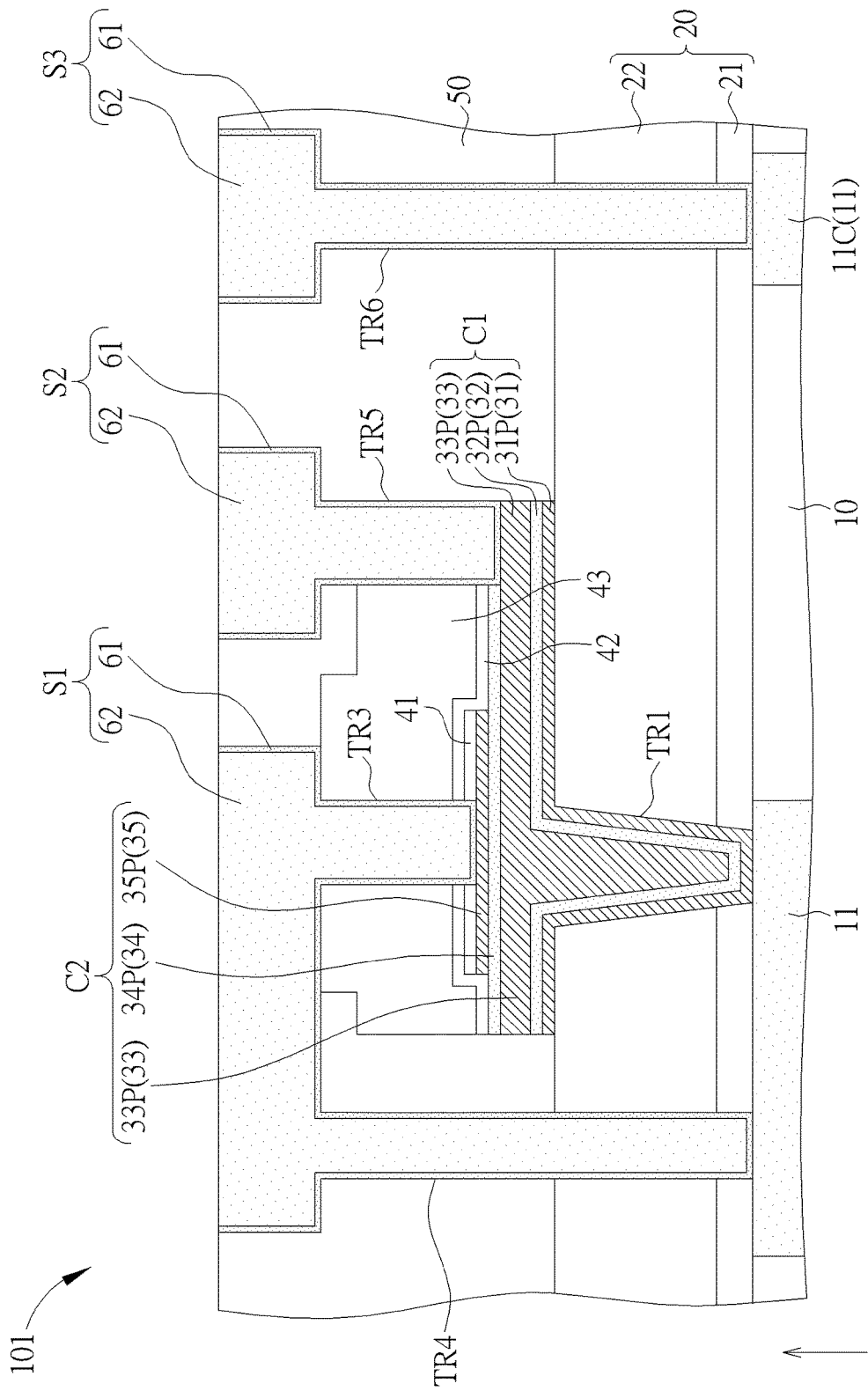
FIG. 1 is a schematic drawing illustrating an integrated circuit according to a first embodiment of the present invention.

Please refer to FIG. 1. FIG. 1 is a schematic drawing illustrating an integrated circuit according to a first embodiment of the present invention. As shown in FIG. 1, an integrated circuit 101 in this embodiment includes a first insulation layer 20, a bottom plate 31P, a first patterned dielectric layer 32P, a medium plate 33P, a second patterned dielectric layer 34P, and a top plate 35P. A first trench TR1 penetrates the first insulation layer 20. The bottom plate 31P is partly disposed on the first insulation layer 20 and partly disposed in the first trench TR1. The first patterned dielectric layer 32P is disposed on the bottom plate 31P, and at least a part of the first patterned dielectric layer 32P is disposed in the first trench TR1. The medium plate 33P is disposed on the first patterned dielectric layer 32P, and at least a part of the medium plate 33P is disposed in the first trench TR1. The bottom plate 31P, the first patterned dielectric layer 32P, and the medium plate 33P constitute a first metal-insulator-metal (MIM) capacitor C1. The second patterned dielectric layer 34P is disposed on the medium plate 33P. The top plate 35P is disposed on the second patterned dielectric layer 34P. The medium plate 33P, the second patterned dielectric layer 34P, and the top plate 35P constitute a second MIM capacitor C2, and the bottom plate 31P is electrically connected with the top plate 35P.

In the integrated circuit 101 of this embodiment, the first MIM capacitor C1 may be at least partially disposed in the first trench TR1. The bottom plate 31P and the first patterned dielectric layer 32P may be formed conformally on the surface of the first trench TR1 for increasing the area of the first patterned dielectric layer 32P sandwiched between the bottom plate 31P and the medium plate 33P in the first MIM capacitor C1, and the capacitance and the capacitance density of the first MIM capacitor may be increased within the limited space accordingly. In other words, at least a part of the first MIM capacitor C1 may be regarded as a 3D MIM capacitor structure, but not limited thereto. Additionally, the bottom plate 31P and the medium plate 33P may be regarded as a bottom electrode and a top electrode of the first MIM capacitor C1 respectively. The medium plate 33P and the top plate 35P may be regarded as a bottom electrode and a top electrode of the second MIM capacitor C2 respectively. In other words, the medium plate 33P may be shared by the first MIM capacitor C1 and the second MIM capacitor C2 for simplifying the structure and the related manufacturing process. Additionally, the first MIM capacitor C1 and the second MIM capacitor C2 may be operated together, and the electrical potential applied to the bottom plate 31P may be substantially equal to the electrical potential applied to the top plate 35P during the operations because the bottom plate 31P is electrically connected with the top plate 35P. In other words, the first MIM capacitor C1 and the second MIM capacitor C2 may be regarded as one integrated capacitor structure, and the capacitance of this capacitor structure may be increased by forming at least a part of the first MIM capacitor C1 in the first trench TR1. The second MIM capacitor C2 may be formed by forming the second patterned dielectric layer 34P and the top plate 35P on the top electrode (i.e. the medium plate 33P) of the first MIM structure C1, and the capacitance and the capacitance density of this capacitor structure may be further increased within the limited space accordingly.

In some embodiments, the integrated circuit 101 may further include a conductive layer 11 disposed under the first insulation layer 20. The first trench TR1 may be disposed on the conductive layer 11, and the bottom plate 31P in the first trench TR1 may contact and be electrically connected with the conductive layer 11, but not limited thereto. In addition, the conductive layer 11 may be disposed in a dielectric layer 10, and the first insulation layer 20 may be disposed on the dielectric layer 10 and the conductive layer 11. In some embodiments, the first insulation layer 20 may be a single layer structure or a multi-layer structure. For example, the first insulation layer 20 may include a first layer 21 and a second layer 22 disposed on the first layer 21. The first layer 21, the second layer 22, and the dielectric layer 10 may include silicon oxide, silicon oxynitride, low dielectric constant (low-k) materials, or other appropriate dielectric materials respectively. In some embodiments, the first insulation layer 20 and the dielectric layer 10 may be an interlayer dielectric layer, such as an inter-metal dielectric (IMD) layer, disposed on a substrate (not shown), but not limited thereto. The substrate mentioned above may include a semiconductor substrate or a non-semiconductor substrate. The semiconductor substrate may include a silicon substrate, a silicon germanium substrate, or a silicon-on-insulator (SOI) substrate, and the non-semiconductor substrate may include a glass substrate, a plastic substrate, or a ceramic substrate, but not limited thereto. In addition, other devices, such as transistors, may be formed on the substrate before the steps of forming the dielectric layer 10 and the first insulation layer 20 according to other considerations, and the first MIM capacitor C1 and the second MIM capacitor C2 may be electrically connected to other devices via the conductive layer 11 and/or a connection structure 11C formed by the conductive layer 11, but not limited thereto.

As shown in FIG. 1, in some embodiments, a projection area of the top plate 35P in a thickness direction Z of the first insulation layer 20 may be smaller than a projection area of the medium plate 33P in the thickness direction Z of the first insulation layer 20, but not limited thereto. Additionally, in some embodiments, the medium plate 33P may be partly disposed on the first insulation layer 20 and partly disposed in the first trench TR1, the second patterned dielectric layer 34P may be disposed outside the first trench TR1, and the second MIM capacitor C2 in this allocation may be regarded as a planar capacitor, but not limited thereto. In other words, in some embodiments, the first trench TR1 may be filled with the bottom plate 31P, the first patterned dielectric layer 32P, and the medium plate 33P. The second patterned dielectric layer 34P and the top plate 35P of the second MIM capacitor C2 may be not formed in the first trench TR1. In addition, one or more mask layers (such as a first mask layer 41, a second mask layer 42, and a third mask layer 43 shown in FIG. 1) may be formed on the top plate 35P according to other considerations, and the integrated circuit 101 may further include a second insulation layer 50 disposed on the first insulation layer 20 and the top plate 35P. The second insulation layer 50 may cover the first MIM capacitor C1, the second MIM capacitor C2, the first mask layer 41, the second mask layer 42, and the third mask layer 43 in the thickness direction Z of the first insulation layer 20.

In some embodiments, the integrated circuit 101 may further include a third trench TR3, a fourth trench TR4, a fifth trench TR5, a first connection structure S1, and a second connection structure S2. The third trench TR3 may penetrate the second insulation layer 50, the third mask layer 43, the second mask layer 42, and the first mask layer 41 for exposing a part of the top plate 35P. The fourth trench TR4 may penetrate the second insulation layer 50 and the first insulation layer 20 and expose a part of the conductive layer 11. The fifth trench TR5 may penetrate the third mask layer 43, the second mask layer 42, and the second patterned dielectric layer 34P for exposing a part of the medium plate 34P. In some embodiments, the third trench TR3 and the fourth trench TR4 may be connected with each other, and the first connection structure S1 may be disposed in the third trench TR3 and the fourth trench TR4. The first connection structure S1 may contact and be electrically connected with the top plate 35P via the third trench TR3. The first connection structure S1 may contact and be electrically connected with the conductive layer 11 via the fourth trench TR4, and the bottom plate 31P may be electrically connected with the top plate 35P via the conductive layer 11 and the first connection structure S1 accordingly. Additionally, in some embodiments, the second connection structure S2 may be disposed in the fifth trench TR5, and the second connection structure S2 may be disposed on and contact the medium plate 33P for being electrically connected with the medium plate 33P. The second connection structure S2 may be electrically separated from the first connection structure S1 preferably for applying electrical potential signals to the medium plate 33P, the top plate 35P, and the bottom plate 31P respectively, but not limited thereto.

Please refer to FIGS. 1-7. FIGS. 2-7 are schematic drawings illustrating a manufacturing method of an integrated circuit according to the first embodiment of the present invention, and FIG. 1 may be regarded as a schematic drawing in a step subsequent to FIG. 7. As shown in FIG. 1, the manufacturing method of the integrated circuit 101 in this embodiment may include the following steps. The first trench TR1 penetrating the first insulation layer 20 is formed first. The bottom plate 31P, the first patterned dielectric layer 32P, the medium plate 33P, the second patterned dielectric layer 34P, and the top plate 35P may be formed subsequently. The bottom plate 31P may be partly formed on the first insulation layer 20 and partly formed in the first trench TR1. The first patterned dielectric layer 32P is formed on the bottom plate 31P, and at least a part of the first patterned dielectric layer 32P is formed in the first trench TR1. The medium plate 33P is formed on the first patterned dielectric layer 32P, and at least a part of the medium plate 33P is formed in the first trench TR1. The second patterned dielectric layer 34P is formed on the medium plate 33P, and the top plate 35P is formed on the second patterned dielectric layer 34P. The bottom plate 31P, the first patterned dielectric layer 32P, and the medium plate 33P form the first MIM capacitor C1. The medium plate 33P, the second patterned dielectric layer 34P, and the top plate 35P form the second MIM capacitor C2, and the bottom plate 31P is electrically connected with the top plate 35P.

Figure 2:
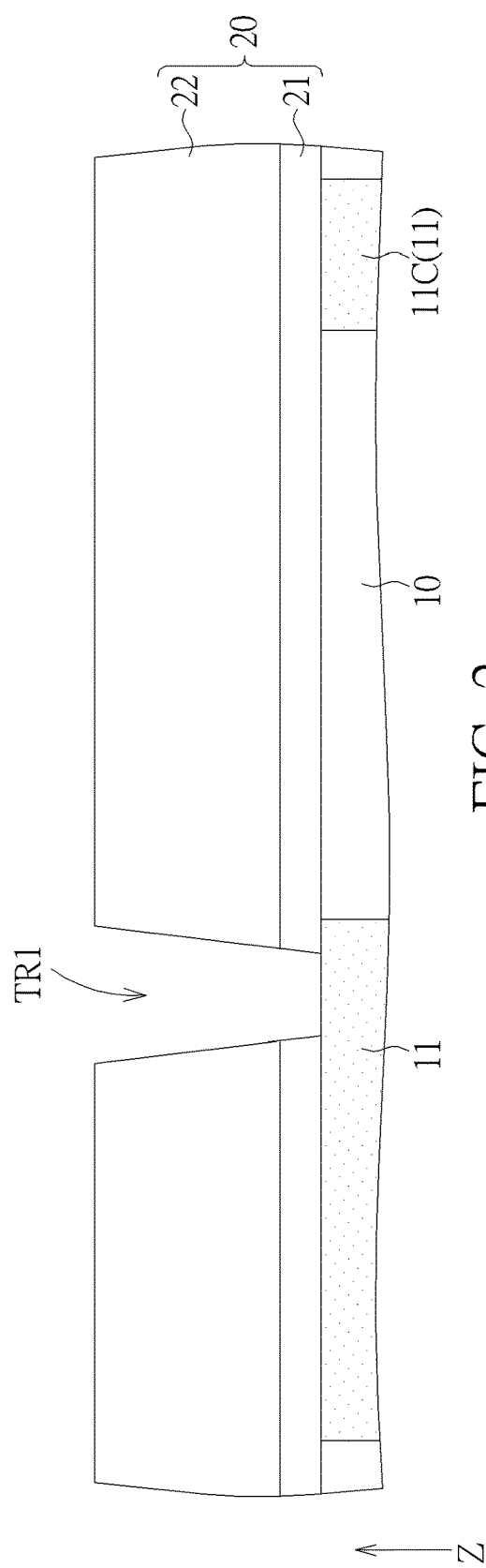
Figure 3:
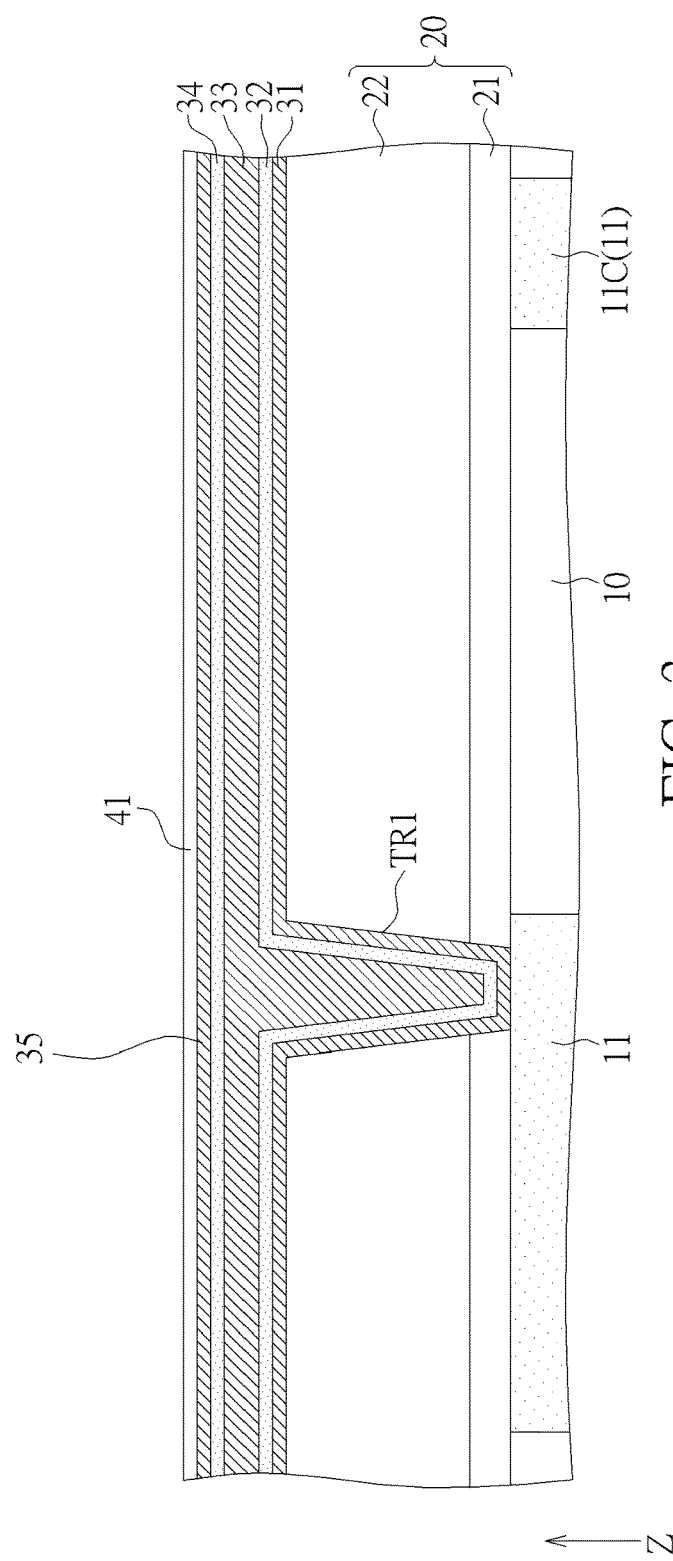

Specifically, the manufacturing method of the integrated circuit 101 in this embodiment may include but is not limited to the following steps. As shown in FIG. 2, the first trench TR1 penetrating the first insulation layer 20 is formed for exposing a part of the conductive layer 11. As shown in FIG. 3, a first metal layer 31, a first dielectric layer 32, a second metal layer 33, a second dielectric layer 34, a third metal layer 35, and the first mask layer 41 are sequentially formed. The conductive layer 11, the first metal layer 31, the second metal layer 33, and the third metal layer 35 may include tungsten (W), aluminum (Al), copper (Cu), titanium aluminide (TiAl), titanium (Ti), titanium nitride (TiN), tantalum (Ta), tantalum nitride (TaN), titanium aluminum oxide (TiAlO), or other suitable conductive materials. The first dielectric layer 32 and the second dielectric layer 34 may include silicon oxide, silicon oxynitride, high dielectric constant (high-k) materials, or other suitable dielectric materials. The high-k material mentioned above may include hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k materials.

Figure 4:
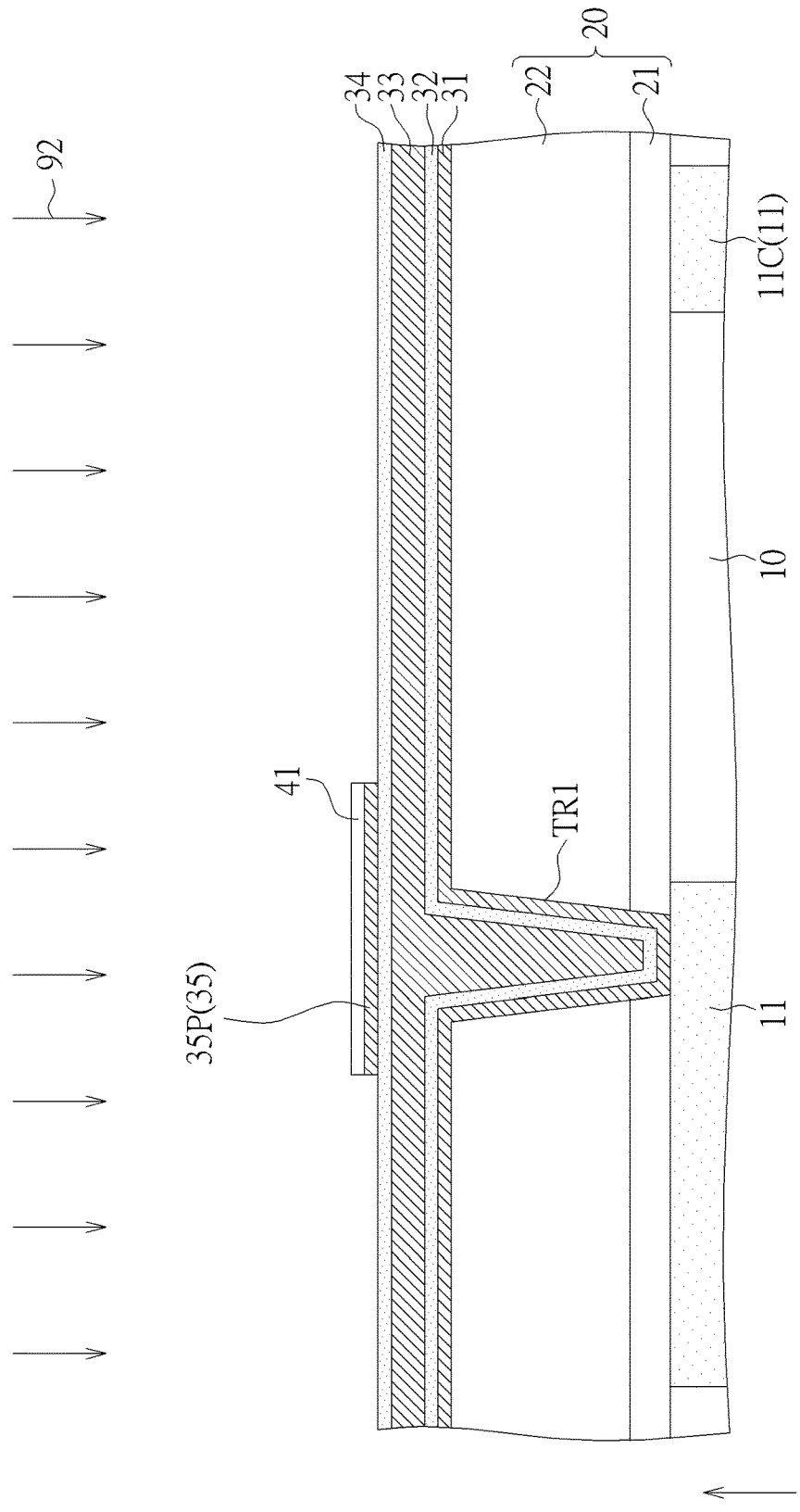
Figure 5:
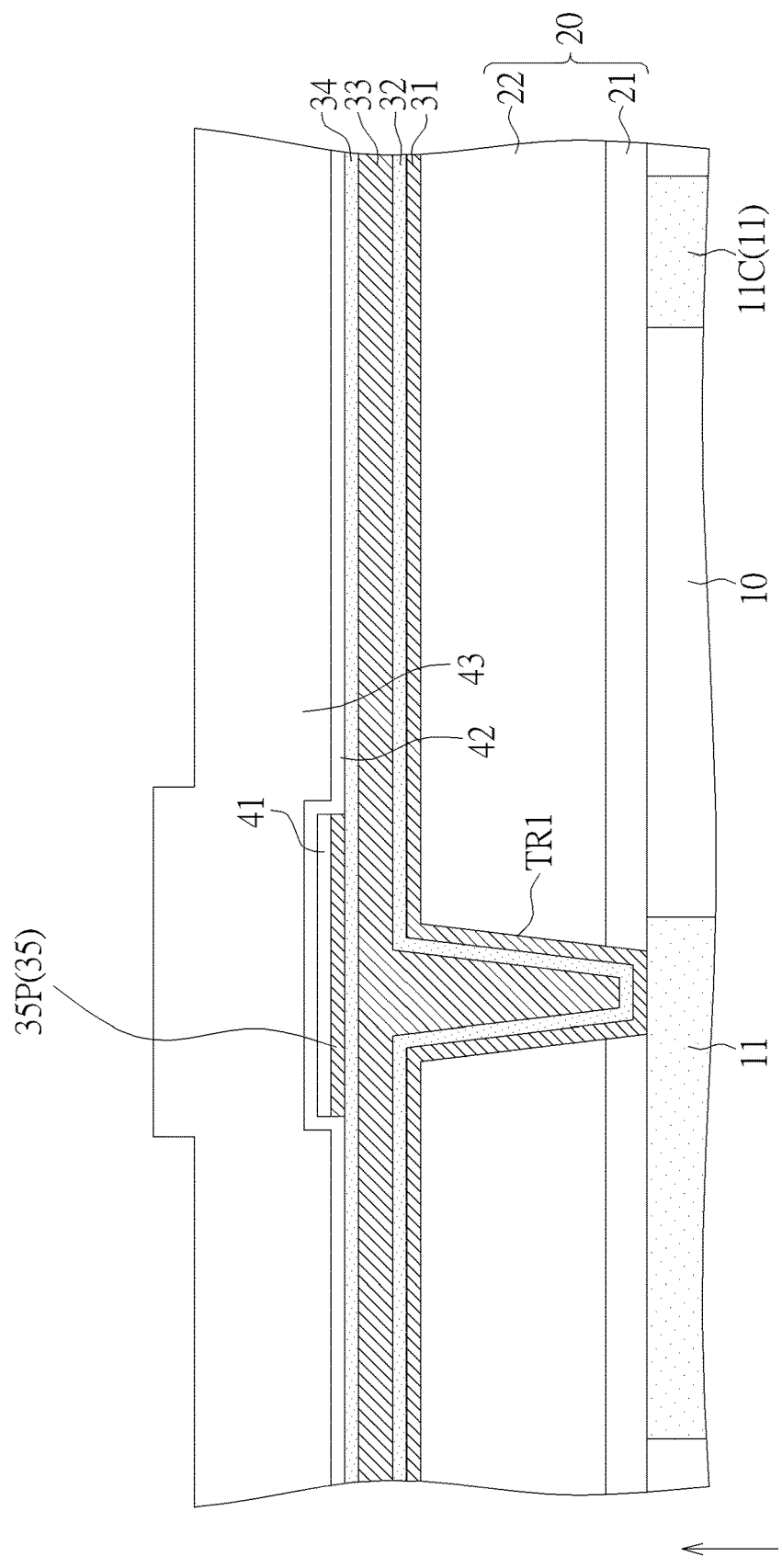

In some embodiments, the first metal layer 31 may be conformally formed on the first insulation layer 20 and in the first trench TR1. The first dielectric layer 32 may be conformally formed on the first metal layer 31. The second metal layer 33 may be formed on the first dielectric layer 32, the second dielectric layer 34 may be formed on the second metal layer 33, and the third metal layer 35 may be formed on the second dielectric layer 34. In some embodiments, the first trench TR1 may be filled with the first metal layer 31, the first dielectric layer 32, and the second metal layer 33. The second dielectric layer 34 and the third metal layer 35 may be not formed in the first trench TR1, but not limited thereto. As shown in FIG. 4, a second patterning process 92 may be performed after the step of forming the third metal layer 35, and the third metal layer 35 may be patterned to be the top plate 35P mentioned above by the second patterning process 92. In some embodiments, the second patterning process 92 may include a photolithographic process and an etching process, and the first mask layer 41 may be used to define the top plate 35P in the etching process, but not limited thereto. As shown in FIG. 4 and FIG. 5, the second mask layer 42 and the third mask layer 43 may be formed and cover the second dielectric layer 34, the top plate 35P and the first mask layer 41 after the second patterning process 92.

Figure 6:
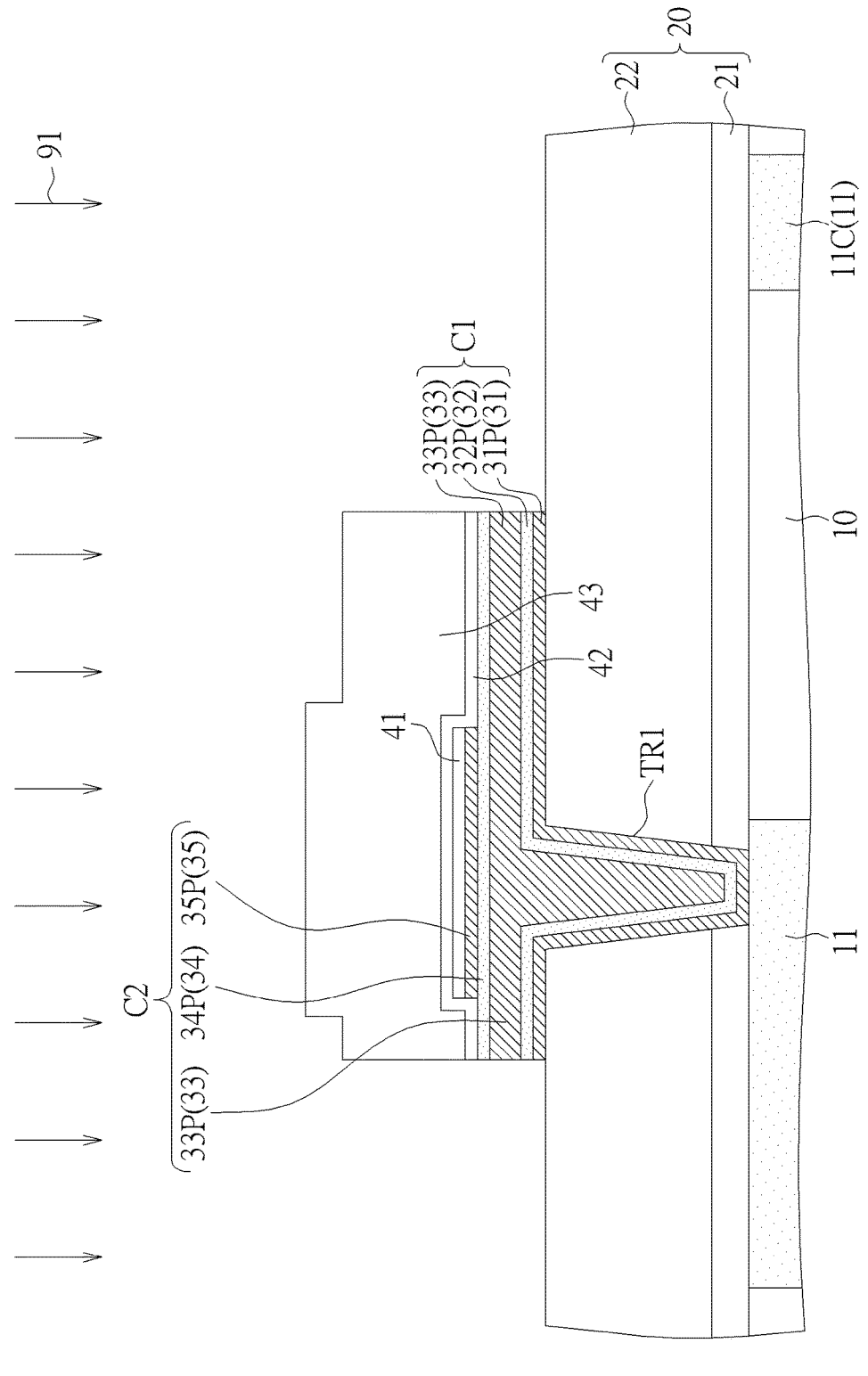

As shown in FIGS. 4-6, a first patterning process 91 is performed. The first metal layer 31 may be patterned to be the bottom plate 31P mentioned above by the first patterning process 91. The first dielectric layer 32 may be patterned to be the first patterned dielectric layer 32P mentioned above by the first patterning process 91. The second metal layer 33 may be patterned to be the medium plate 33P mentioned above by the first patterning process 91. The second dielectric layer 34 may be patterned to be the second patterned dielectric layer 34P mentioned above by the first patterning process 91. In some embodiments, the first patterning process 91 may include a photolithographic process and an etching process, and the second mask layer 42 and/or the third mask layer may be used to define the bottom plate 31P, the first patterned dielectric layer 32P, the medium plate 33P, and the second patterned dielectric layer 34P in the etching process, but not limited thereto. In other words, a projection area of the bottom plate 31P, a projection area of the first patterned dielectric layer 32P, a projection area of the medium plate 33P, and a projection area of the second patterned dielectric layer 34P may be substantially equal to one another in the thickness direction Z of the first insulation layer 20, but not limited thereto. In addition, the projection area of the top plate 35P in the thickness direction Z of the first insulation layer 20 is smaller than the projection area of the medium plate 33P in the thickness direction Z of the first insulation layer 20 preferably because there has to be space for forming a connection structure on the medium plate 33P. The medium plate 33P, which is formed by patterning the second metal layer 33, may be partly formed on the first dielectric layer 32 and partly formed in the first trench TR1, and the second patterned dielectric layer 34P and the top plate 35P may be formed outside the first trench TR1 because the first trench TR1 may be filled with the first metal layer 31, the first dielectric layer 32, and the second metal layer 33, and the second dielectric layer 34 and the third metal layer 35 may be not formed in the first trench TR1.

It is worth noting that the method of forming the bottom plate 31P, the first patterned dielectric layer 32P, the medium plate 33P, the second patterned dielectric layer 34P, and the top plate 35P in the present invention is not limited to the approaches mentioned above. For example, in some embodiments, the top plate 35P may be defined by the second patterning process 92, and the bottom plate 31P, the first patterned dielectric layer 32P, the medium plate 33P, and the second patterned dielectric layer 34P may be defined together by the first patterning process 91 performed after the second patterning process 92. However, in some embodiments, the bottom plate 31P, the first patterned dielectric layer 32P, the medium plate 33P, and the second patterned dielectric layer 34P may be formed before the step of forming the top plate 35P according to other considerations. In some embodiments, the bottom plate 31P, the first patterned dielectric layer 32P, the medium plate 33P, the second patterned dielectric layer 34P, and the top plate 35P may also be formed respectively by different patterning processes or be formed by the same patterning process.

Figure 7:
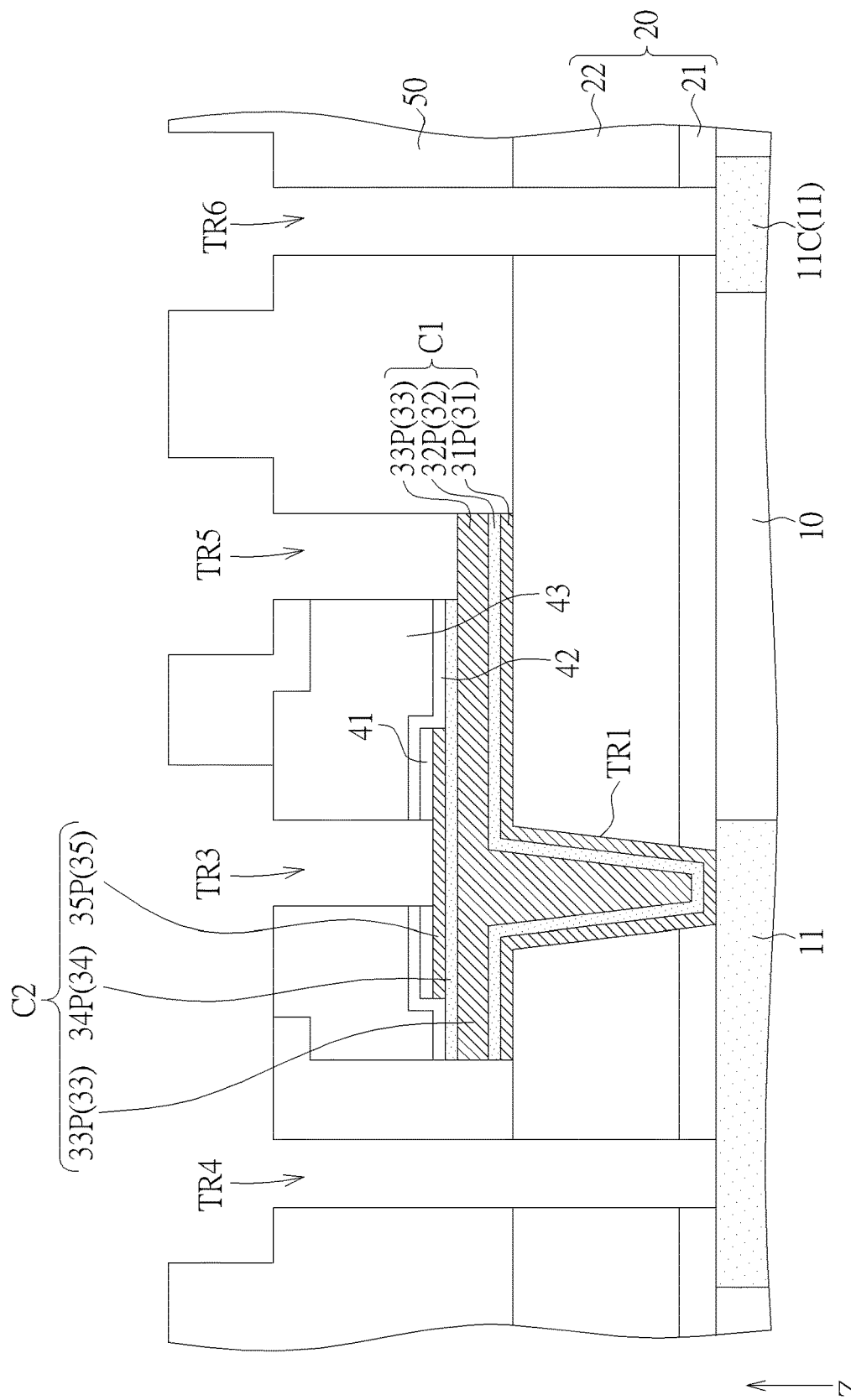

As shown in FIG. 7, the second insulation layer 50 may be formed on the first insulation layer 20 and the top plate 35P. The second insulation layer 50 may cover the first MIM capacitor C1, the second MIM capacitor C2, the first mask layer 41, the second mask layer 42, and the third mask layer 43 in the thickness direction Z of the first insulation layer 20. Subsequently, the third trench TR3, the fourth trench TR4, and the fifth trench TR5 mentioned above and a sixth trench TR6 may be formed. The sixth trench TR6 may penetrate the first insulation layer 20 and the second insulation layer 50 covering the connection structure 11C for exposing at least a part of the connection structure 11C. As shown in FIG. 1, the first connection structure S1 mentioned above may be formed in the third trench TR3 and the fourth trench TR4, the second connection structure S2 mentioned above may be formed in the fifth trench TR5, and a third connection structure S3 may be formed in the sixth trench TR6. The first connection structure S1 may contact and be electrically connected with the top plate 35P and the conductive layer 11 respectively via the third trench TR3 and the fourth trench TR4, and the bottom plate 31P may be electrically connected with the top plate 35P via the conductive layer 11 and the first connection structure S1. The second connection structure S2 may be formed on the medium plate 33P and the second connection structure S2 may contact and be electrically connected with the medium plate 33P. The second connection structure S2 may be electrically separated from the first connection structure S1, but not limited thereto. The first connection structure S1, the second connection structure S2, and the third connection structure S3 may respectively include a barrier layer 61 and a low resistivity material layer 62. The barrier layer 61 may include titanium nitride (TiN), tantalum nitride (TaN), or other suitable barrier materials, and the low resistivity material layer 62 may include materials with relatively lower resistivity, such as copper, aluminum, and tungsten, but not limited thereto. Additionally, in some embodiments, the connection structure 11C and the third connection structure S3 may be interconnection structures formed on the substrate having semiconductor devices, and the first connection structure S1, the second connection structure S2, and the third connection structure S3 may be formed together by the same manufacturing process. In other words, the manufacturing method of the first MIM capacitor C1 and the second MIM capacitor C2 may be integrated with the manufacturing method of the interconnection structures, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 8:
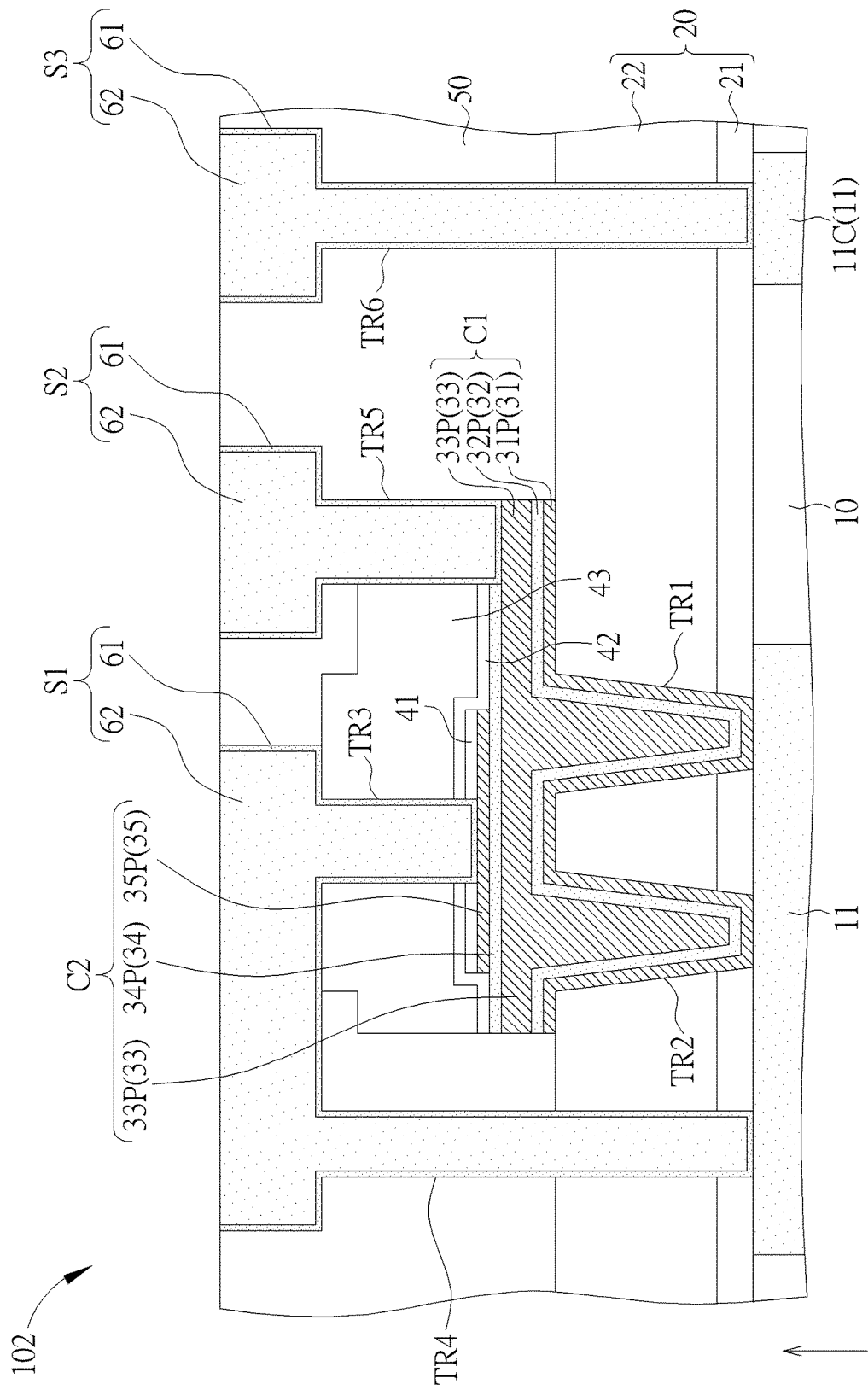
FIG. 8 is a schematic drawing illustrating an integrated circuit according to a second embodiment of the present invention.

Please refer to FIG. 8. FIG. 8 is a schematic drawing illustrating an integrated circuit 102 according to a second embodiment of the present invention. As shown in FIG. 8, the difference between the integrated circuit 102 in this embodiment and the integrated circuit in the first embodiment mentioned above is that the integrated circuit 102 in this embodiment may further include a second trench TR2 penetrating the first insulation layer 20. Apart of the bottom plate 31P, a part of the first patterned dielectric layer 32P, and a part of the medium plate 33P may be disposed in the second trench TR2. In other words, the manufacturing method of the integrated circuit 102 of this embodiment may further include forming the second trench TR2 penetrating the first insulation layer 20. A part of the bottom plate 31P, apart of the first patterned dielectric layer 32P, and a part of the medium plate 33P may be formed in the second trench TR2. The first MIM capacitor C1 may be partially formed in a plurality of trenches for further increasing the capacitance and the capacitance density of the first MIM capacitor C1. For example, the capacitance of this embodiment may be increased by about 58% of the capacitance of the first embodiment when the depth of the first trench TR1 and the second trench TR2 is about 300 nanometers and the width of the first trench TR1 and the second trench TR2 is about 100 nanometers respectively, but not limited thereto.

Figure 9:
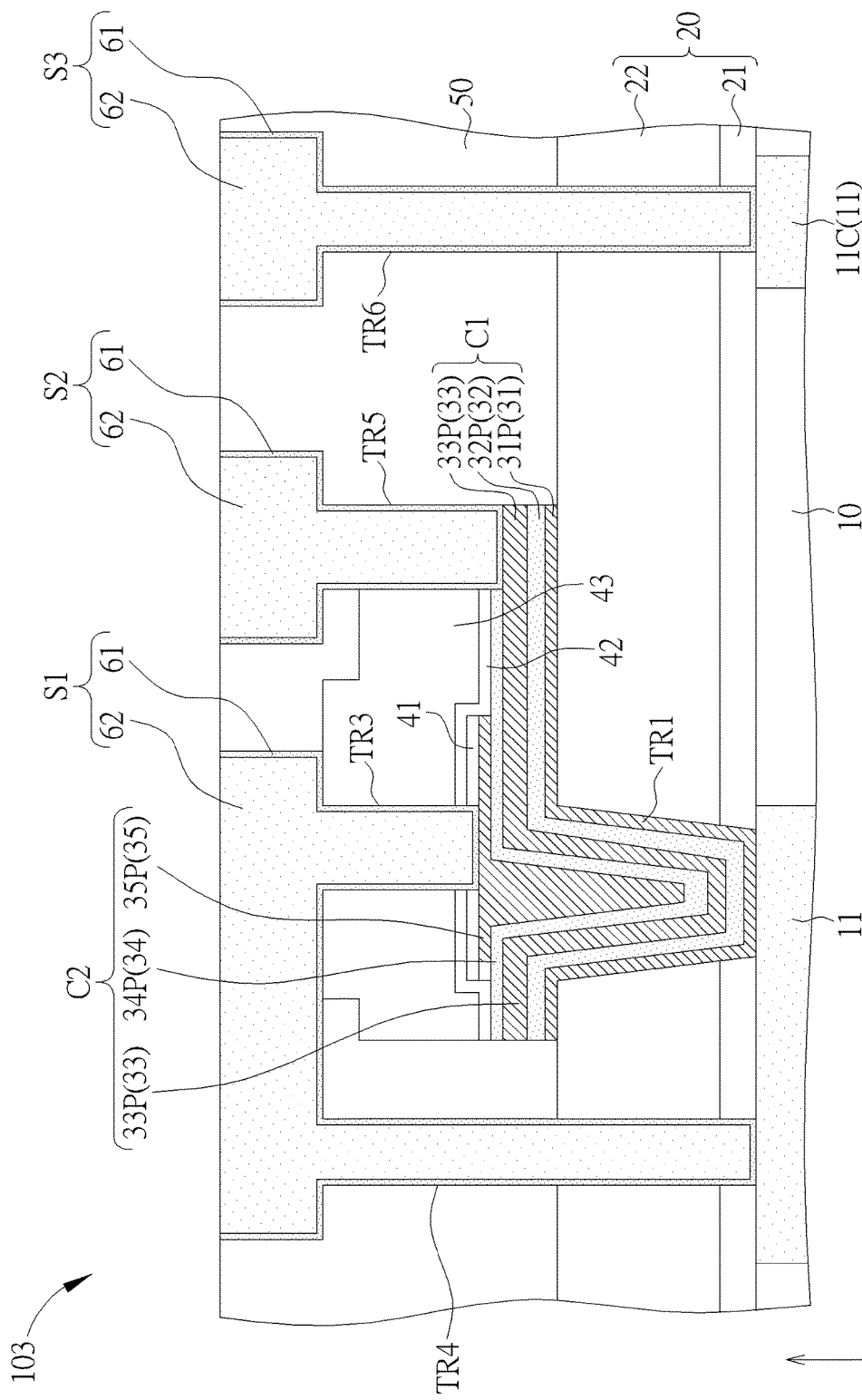
FIG. 9 is a schematic drawing illustrating an integrated circuit according to a third embodiment of the present invention.

Please refer to FIG. 9. FIG. 9 is a schematic drawing illustrating an integrated circuit 103 according to a third embodiment of the present invention. As shown in FIG. 9, the difference between the integrated circuit 103 in this embodiment and the integrated circuit in the first embodiment mentioned above is that the second metal layer 33 for forming the medium plate 33P may be conformally formed on the first dielectric layer 32, and the second dielectric layer 34 for forming the second patterned dielectric layer 34P may be conformally formed on the second metal layer 33. Therefore, at least apart of the second patterned dielectric layer 34P and at least a part of the top plate 35P may be formed in the first trench TR1, and the first trench TR may be filled with the bottom plate 31P, the second patterned dielectric layer 32P, the medium plate 33P, the second patterned dielectric layer 34P, and the top plate 35P. In this condition, the second MIM capacitor C2 may also be regarded as a 3D MIM capacitor for further increasing the capacitance and the capacitance density. For example, the capacitance of this embodiment may be increased by about 17% of the capacitance of the first embodiment when the depth and the width of the first trench TR1 are about 300 nanometers and 100 nanometers respectively, but not limited thereto.

To summarize the above descriptions, in the integrated circuit and the manufacturing method thereof according to the present invention, the medium plate may be shared by the first MIM capacitor and the second MIM capacitor overlapping each other. The bottom plate may be electrically connected with the top plate for operating the first MIM capacitor and the second MIM capacitor simultaneously. Therefore, the first MIM capacitor and the second MIM capacitor may be regarded as one integrated capacitor structure, the capacitance may be increased by forming at least a part of the first MIM process in the trench, and the second MIM capacitor may be constituted by forming the patterned dielectric layer and the top plate on the top electrode of the first MIM capacitor. The capacitance and the capacitance density may be further increased within the limited space accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An integrated circuit, comprising:
a first insulation layer, wherein a first trench penetrates the first insulation layer;
a bottom plate partly disposed on the first insulation layer and partly disposed in the first trench;

a first patterned dielectric layer disposed on the bottom plate, wherein at least a part of the first patterned dielectric layer is disposed in the first trench;
a medium plate disposed on the first patterned dielectric layer, wherein at least a part of the medium plate is disposed in the first trench, and wherein the bottom plate, the first patterned dielectric layer, and the medium plate constitute a first metal-insulator-metal (MIM) capacitor;
a second patterned dielectric layer disposed on the medium plate; and
a top plate disposed on the second patterned dielectric layer, wherein the medium plate, the second patterned dielectric layer, and the top plate constitute a second MIM capacitor, and the bottom plate is electrically connected with the top plate, wherein the top plate is electrically separated from the medium plate, and the bottom plate is electrically separated from the medium plate.

2. The integrated circuit according to claim 1, wherein a projection area of the top plate in a thickness direction of the first insulation layer is smaller than a projection area of the medium plate in the thickness direction of the first insulation layer.

3. The integrated circuit according to claim 1, wherein the medium plate is partly disposed on the first insulation layer and partly disposed in the first trench, and the second patterned dielectric layer is disposed outside the first trench.

4. The integrated circuit according to claim 1, further comprising:
a second trench penetrating the first insulation layer, wherein a part of the bottom plate, a part of the first patterned dielectric layer, and a part of the medium plate are disposed in the second trench.

5. The integrated circuit according to claim 1, wherein at least a part of the second patterned dielectric layer and at least a part of the top plate are disposed in the first trench.

6. The integrated circuit according to claim 1, further comprising:
a conductive layer disposed under the first insulation layer, wherein the first trench is disposed on the conductive layer, and the bottom plate in the first trench is electrically connected with the conductive layer.

7. The integrated circuit according to claim 6, further comprising:
a second insulation layer disposed on the first insulation layer and the top plate;
a third trench penetrating the second insulation layer and exposing a part of the top plate;
a fourth trench penetrating the second insulation layer and the first insulation layer and exposing a part of the conductive layer; and
a first connection structure disposed in the third trench and the fourth trench, wherein the bottom plate is electrically connected with the top plate via the conductive layer and the first connection structure.

8. The integrated circuit according to claim 7, further comprising:
a second connection structure disposed on and electrically connected with the medium plate, wherein the second connection structure is electrically separated from the first connection structure.

9. The integrated circuit according to claim 1, wherein the first trench is filled with the bottom plate, the first patterned dielectric layer, and the medium plate.

10. The integrated circuit according to claim 1, wherein the first trench is filled with the bottom plate, the first patterned dielectric layer, the medium plate, the second patterned dielectric layer, and the top plate.

11. A manufacturing method of an integrated circuit, comprising:
forming a first trench penetrating a first insulation layer;
forming a bottom plate partly on the first insulation layer and partly in the first trench;
forming a first patterned dielectric layer on the bottom plate, wherein at least a part of the first patterned dielectric layer is formed in the first trench;
forming a medium plate on the first patterned dielectric layer, wherein at least a part of the medium plate is formed in the first trench, and wherein the bottom plate, the first patterned dielectric layer, and the medium plate form a first metal-insulator-metal (MIM) capacitor;
forming a second patterned dielectric layer on the medium plate; and
forming a top plate on the second patterned dielectric layer, wherein the medium plate, the second patterned dielectric layer, and the top plate form a second MIM capacitor, and the bottom plate is electrically connected with the top plate, wherein the top plate is electrically separated from the medium plate, and the bottom plate is electrically separated from the medium plate.

12. The manufacturing method of the integrated circuit according to claim 11, wherein the steps of forming the bottom plate, the first patterned dielectric layer, the medium plate, and the second patterned dielectric layer comprise:
forming a first metal layer conformally on the first insulation layer and in the first trench;
forming a first dielectric layer conformally on the first metal layer;
forming a second metal layer on the first dielectric layer;
forming a second dielectric layer on the second metal layer; and
performing a first patterning process after the step of forming the second dielectric layer, wherein the first metal layer is patterned to be the bottom plate, the first dielectric layer is patterned to be the first patterned dielectric layer, the second metal layer is patterned to be the medium plate, and the second dielectric layer is patterned to be the second patterned dielectric layer by the first patterning process.

13. The manufacturing method of the integrated circuit according to claim 12, wherein the step of forming the top plate comprises:
forming a third metal layer on the second dielectric layer; and
performing a second patterning process after the step of forming the third metal layer, wherein the third metal layer is patterned to be the top plate by the second patterning process, and the second patterning process is performed before the first patterning process.

14. The manufacturing method of the integrated circuit according to claim 11, wherein a projection area of the top plate in a thickness direction of the first insulation layer is smaller than a projection area of the medium plate in the thickness direction of the first insulation layer.

15. The manufacturing method of the integrated circuit according to claim 11, wherein the medium plate is partly formed on the first insulation layer and partly formed in the first trench, and the second patterned dielectric layer is formed outside the first trench.

16. The manufacturing method of the integrated circuit according to claim 11, further comprising:
forming a second trench penetrating the first insulation layer, wherein a part of the bottom plate, a part of the first patterned dielectric layer, and a part of the medium plate are formed in the second trench.

17. The manufacturing method of the integrated circuit according to claim 11, wherein at least a part of the second patterned dielectric layer and at least a part of the top plate are formed in the first trench.

18. The manufacturing method of the integrated circuit according to claim 11, wherein a conductive layer is formed under the first insulation layer, and the bottom plate in the first trench is electrically connected with the conductive layer.

19. The manufacturing method of the integrated circuit according to claim 18, further comprising:
   forming a second insulation layer on the first insulation layer and the top plate;
   forming a third trench penetrating the second insulation layer and exposing a part of the top plate;
   forming a fourth trench penetrating the second insulation layer and the first insulation layer and exposing a part of the conductive layer; and
   forming a first connection structure in the third trench and the fourth trench, wherein the bottom plate is electrically connected with the top plate via the conductive layer and the first connection structure.

20. The manufacturing method of the integrated circuit according to claim 19, further comprising:
   forming a second connection structure on the medium plate, and the second connection structure being electrically connected with the medium plate, wherein the second connection structure is electrically separated from the first connection structure.

* * * * *